US008582333B2

(12) United States Patent
Oraw et al.

(10) Patent No.: US 8,582,333 B2
(45) Date of Patent: Nov. 12, 2013

(54) INTEGRATION OF SWITCHED CAPACITOR NETWORKS FOR POWER DELIVERY

(75) Inventors: Bradley S. Oraw, Mesa, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1343 days.

(21) Appl. No.: 12/165,484

(22) Filed: Jun. 30, 2008

(65) Prior Publication Data

US 2009/0322414 A1    Dec. 31, 2009

(51) Int. Cl.
*G05F 1/00* (2006.01)
*H05K 1/00* (2006.01)
*H05K 1/18* (2006.01)
*H05K 7/00* (2006.01)
*H05K 7/10* (2006.01)
*H05K 7/12* (2006.01)
*H02M 3/18* (2006.01)
*H02M 7/00* (2006.01)
*H02M 1/00* (2007.01)

(52) U.S. Cl.
USPC ............ 363/62; 323/266; 361/748; 361/760; 361/767; 363/59; 363/60; 363/147

(58) Field of Classification Search
USPC ............... 323/266; 363/59–62, 147; 361/748, 361/760, 761, 763, 764, 767, 784
See application file for complete search history.

(56) References Cited

U.S. PATENT DOCUMENTS

| | | | |
|---|---|---|---|
| 5,608,614 A | 3/1997 | Ohnishi et al. | |
| 5,621,685 A * | 4/1997 | Cernea et al. | 365/185.18 |
| 6,438,005 B1 | 8/2002 | Walter | |
| 6,654,264 B2 | 11/2003 | Rose | |
| 6,853,569 B2 | 2/2005 | Cheng et al. | |
| 6,947,300 B2 | 9/2005 | Pai et al. | |
| 7,116,009 B2 | 10/2006 | Tamai et al. | |
| 7,271,626 B1 | 9/2007 | Burinskiy et al. | |
| 7,365,523 B2 | 4/2008 | Malherbe et al. | |
| 7,397,151 B2 | 7/2008 | Ishino | |
| 7,397,157 B2 | 7/2008 | Maekawa et al. | |
| 7,498,783 B2 | 3/2009 | Johnson | |
| 7,928,705 B2 | 4/2011 | Hooijschuur et al. | |

(Continued)

OTHER PUBLICATIONS

Oraw, Bradley S., et al., "Switched Capacitor Converters", U.S. Appl. No. 11/694,391, filed Mar. 30, 2007, 1-39.
Office Action for U.S. Appl. No. 12/165,492 dated Mar. 15, 2011, 9 pages.
Final Office Action for U.S. Appl. No. 12/165,492 dated Oct. 3, 2011, 14 pages.

(Continued)

*Primary Examiner* — Adolf Berhane
*Assistant Examiner* — Gary Nash
(74) *Attorney, Agent, or Firm* — Blakely, Sokoloff, Taylor & Zafman LLP

(57) ABSTRACT

Switched capacitor networks for power delivery to packaged integrated circuits. In certain embodiments, the switched capacitor network is employed in place of at least one stage of a cascaded buck converter for power delivery. In accordance with particular embodiments of the present invention, a two-stage power delivery network comprising both switched capacitor stage and a buck regulator stage deliver power to a microprocessor or other packaged integrated circuit (IC). In further embodiments, a switched capacitor stage is implemented with a series switch module comprising low voltage MOS transistors that is then integrated onto a package of at least one IC to be powered. In certain embodiments, a switched capacitor stage is implemented with capacitors formed on a motherboard, embedded into an IC package or integrated into a series switch module.

11 Claims, 5 Drawing Sheets

(56) References Cited

U.S. PATENT DOCUMENTS

| | | | |
|---|---|---|---|
| 2005/0030084 A1* | 2/2005 | Watanabe et al. | 327/423 |
| 2005/0077978 A1* | 4/2005 | Kizuki et al. | 333/103 |
| 2006/0176033 A1 | 8/2006 | Malherbe et al. | |
| 2007/0296383 A1* | 12/2007 | Xu et al. | 323/282 |
| 2008/0018380 A1* | 1/2008 | Campardo et al. | 327/536 |
| 2008/0164562 A1* | 7/2008 | Wang et al. | 257/528 |
| 2008/0239772 A1* | 10/2008 | Oraw et al. | 363/60 |
| 2009/0230507 A1* | 9/2009 | Riess et al. | 257/532 |
| 2009/0261890 A1* | 10/2009 | Fifield et al. | 327/536 |

OTHER PUBLICATIONS

Office Action for U.S. Appl. No. 12/165,492 dated Feb. 29, 2012, 13 pages.

Notice of Allowance for U.S. Appl. No. 12/165,492 dated Jul. 18, 2012, 10 pages.

Office Action for U.S. Appl. No. 11/694,391 dated Jun. 25, 2009, 6 pages.

Notice of Allowance for U.S. Appl. No. 11/694,391 dated Dec. 3, 2009, 6 pages.

* cited by examiner

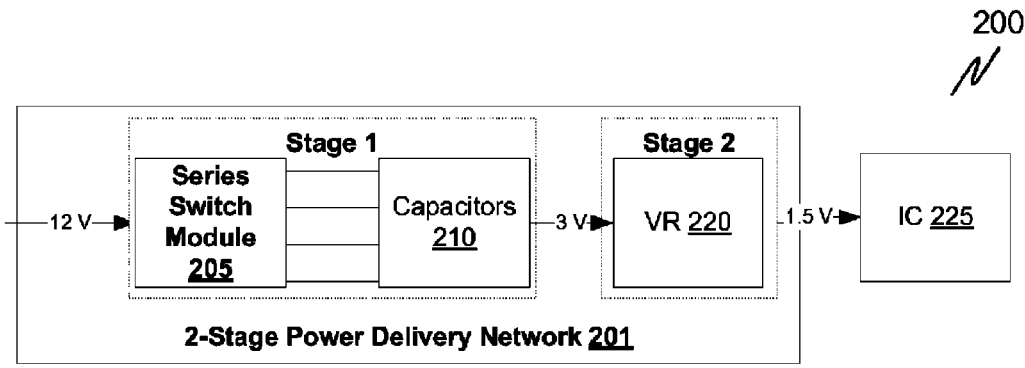
FIG. 2
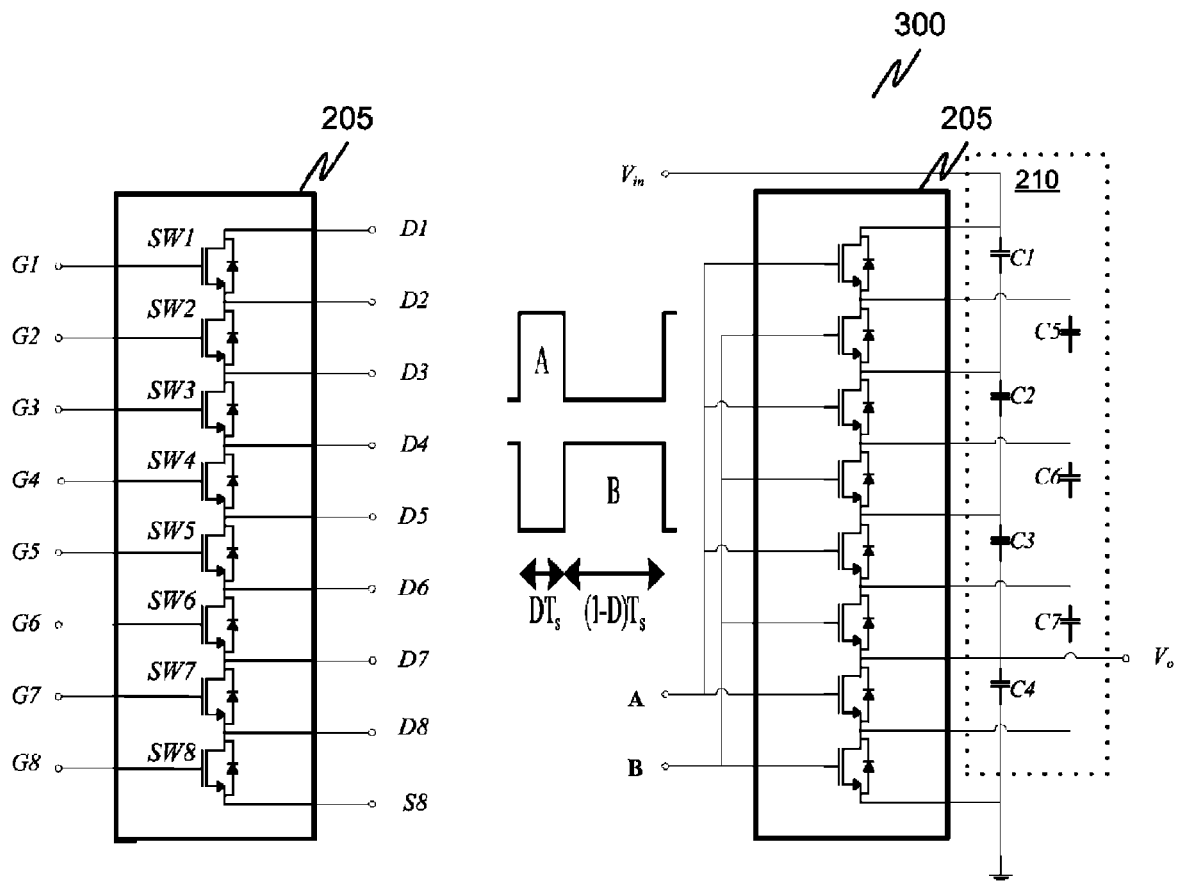
FIG. 3A  FIG. 3B

INTEGRATION OF SWITCHED CAPACITOR NETWORKS FOR POWER DELIVERY

TECHNICAL FIELD

Embodiments of the present invention are in the field of semiconductor devices, more specifically pertaining to integration of switched capacitor networks for power delivery.

BACKGROUND

Presently, voltage regulators are being integrated onto the packages of microprocessors within computing devices. However, the present solutions for on-package voltage regulators employ an external voltage regulator that down-converts a 12 volt (V) supply to an intermediate 3V input voltage (e.g., 3V) for the on-package regulator. For example, as shown in FIG. 1, a conventional power delivery scheme includes a 12V supply 106 on motherboard 105 that is coupled to the motherboard voltage regulator (MBVR) 110. The MBVR 110 is further coupled to an integrated voltage regulator (IVR) 120 to supply the IVR 120 with a regulated 3V power source. The IVR 120 is integrated onto the package 115 housing the central processing unit (CPU) 125 to provide the CPU 125 with a regulated 1.5V power source.

Personal computing devices are trending towards smaller sizes with a simultaneous increase in the number of features. The power delivery network requirements of the devices are therefore increasing while the motherboard space for such a network shrinks. Typically, the MBVR 110 is a buck-type regulator employing at least one magnetic device, such as an inductor, in each phase. However, such magnetic components require a significant amount of area, making it unpractical to integrate them onto the package substrate. In addition, they are relatively inefficient when operated at lights loads. A need exists for a readily scalable power delivery network which can be operated efficiently over a range of loads and can be integrated into a smaller form factor.

BRIEF DESCRIPTION OF THE DRAWINGS

Embodiments of the present invention are illustrated by way of example, and not limitation, in the figures of the accompanying drawings in which:

FIG. 2 is a block diagram of a 2-stage power delivery network employing a series switch module in the first stage, in accordance with one embodiment;

FIG. 3A is a circuit diagram of a series switch module, in accordance with one embodiment;

FIG. 3B is a circuit diagram of a series switch module coupled to capacitors, in accordance with one embodiment of a switched capacitor network;

DETAILED DESCRIPTION

Figure 1:
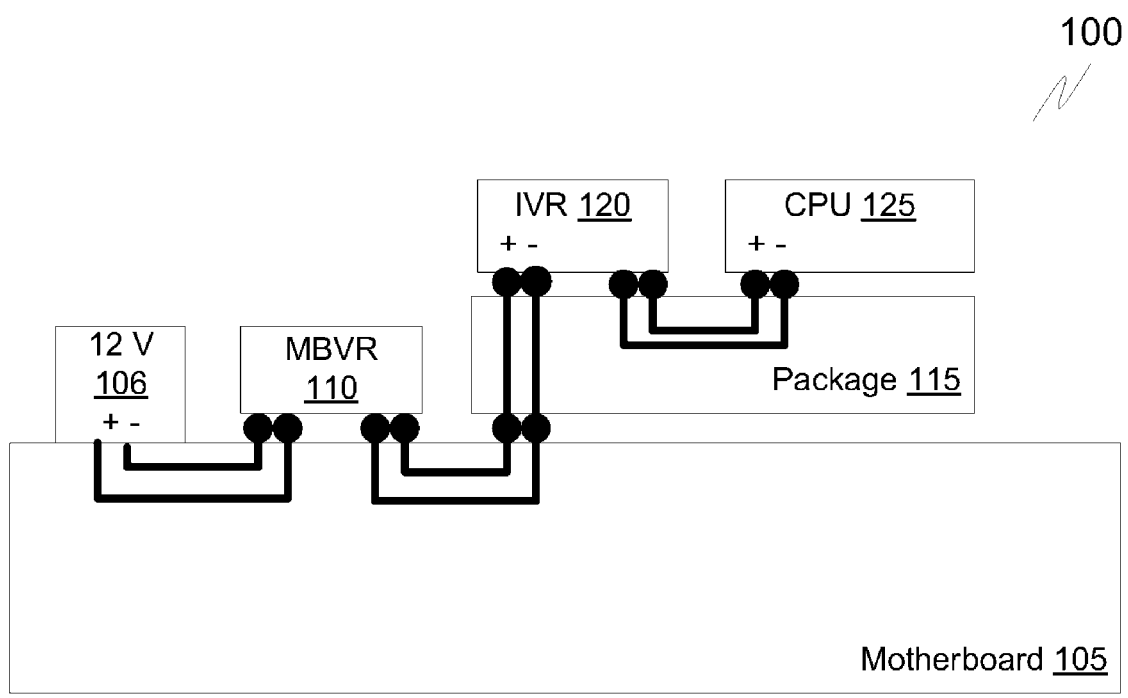
FIG. 1 is a block diagram schematically illustrating a cross-sectional view of a conventionally implemented power delivery system using a 2-stage voltage conversion.

Embodiments of a switched capacitor network for power delivery are described herein with reference to figures. In certain embodiments, the switched capacitor network is employed in place of at least one stage of cascaded buck converters for power delivery (e.g., to provide a 3V output from a 12V input supply voltage on a motherboard). In accordance with particular embodiments of the present invention, a two-stage power delivery network comprising both switched capacitor stage and a buck regulator stage deliver power to a microprocessor or other packaged integrated circuit (IC). In further embodiments, a switched capacitor stage is implemented with a series switch module integrated onto a package of at least one IC to be powered. In certain embodiments, a switched capacitor stage is implemented with capacitors formed on a motherboard supporting a package of an IC to be powered by the regulator. In certain other embodiments, a switched capacitor stage is implemented with capacitors embedded into a package of an IC to be powered by the regulator. In still other embodiments, a switched capacitor stage is implemented with metal-insulator-metal (MIM) capacitors integrated into a series switch module mounted on a package of an IC to be powered.

However, particular embodiments may be practiced without one or more of these specific details, or in combination with other known methods, materials, and apparatuses. In the following description, numerous specific details are set forth, such as specific materials, dimensions and material parameters etc. to provide a thorough understanding of the present invention. In other instances, well-known design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. For example, a first embodiment may be combined with a second embodiment anywhere the two embodiments are not mutually exclusive.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a motherboard without consideration of the absolute orientation of the motherboard.

A switched capacitor network generally operates as a charge pump or DC transformer and may be employed for conversion of DC voltages. Switched capacitor network topologies suitable for IC power delivery are described in U.S. patent application Ser. No. 11/694,391, filed Mar. 30, 2007 and commonly owned. As disclosed therein, such switched capacitor networks are readily scaleable to provide multiple power rails and outputs, as required, for powering any number of IC's at a variety of operating voltages. Furthermore, a switched capacitor network employed at the input of a buck converter (e.g., a first stage in a two-stage power delivery network) results in a smaller conversion ratio for the second buck stage to combine for higher overall efficiency in the power delivery network.

In embodiments of the present invention, a two-stage power delivery network employs a switched capacitor network as a first stage and a buck-type switching regulator as a second stage with the switched capacitor network stage employing a series switch module. FIG. 2 depicts an exemplary two-stage power delivery network 201. The two-stage power delivery network 201 has a first stage including a series switch module (SSM) 205 and capacitors 210 as components of a switched capacitor network. The second stage includes a voltage regulator (VR) 220, which may be a buck-type switching regulator or any other regulator employed in the art. The output voltage of the first stage is the input voltage to the second stage with the output voltage of the second stage being the input voltage to the IC 225 to be powered. IC 225 can be of any known type, such as a microprocessor or microcontroller, memory circuit, application specific integrated circuit (ASIC), digital signal processor (DSP), a radio frequency circuit, an amplifier, a power converter, a filter, a clocking circuit, and the like. In a preferred embodiment, the IC 225 is a CPU of an electronic device. In the depicted example, the input voltage to the first stage is 12V and may be a motherboard supply voltage. In other embodiments, the input voltage to the first stage is from a battery supply in the range of about 2.8 V to 4.2 V. In the exemplary embodiment, the switched capacitor divider first stage down-converts the 12V input to a 3V output and the buck-type voltage regulator second stage regulates the 3V down to 1.5V for the voltage input to IC 225. In other embodiments, the switched capacitor divider first stage outputs other voltage values such as 3.3V or 2.8V while the regulated CPU voltage maybe lower than 1.5V (e.g., any intentional value between 1V and 1.5V).

A series switch module includes series connected switches. In an embodiment, the series switch module 205 includes switches SW1-SW8 connected in series. In one such embodiment, the series switch module 205 splits out the pins for all switch terminals (e.g., gate (G), source (S) and drain (D) pins for MOSFET switches). While the MOSFET switches may be implemented with VMOS or LDMOS power transistors, in a preferred embodiment all switches of the series switch module 205 are CMOS transistors of the type typically employed for low voltage (e.g., 1.5V) logic applications. Such CMOS transistors have lower gate capacitance and lower output resistance than either VMOS or LDMOS for higher efficiency.

FIG. 3A depicts an exemplary implementation of a series switch module 205 for a divide-by-four switched capacitor divider which might be employed as the first stage in the two-stage power delivery network 201. As depicted, the series switch module 205 includes MOSFETs SW1-SW8, including 8 gate pins (G1 through G8), 8 drain pins (D1-D8) and one source pin (S8), configured in series. In other embodiments, the series switch module 205 further includes a pulse width modulator (PWM) and gate drivers. In particular embodiments, the series switching module 205 to be configured with external capacitors to operate as a voltage divider, inverter or doubler, etc.

Series switch module 205 may then be coupled with capacitors 210 to form a switched capacitor network. An exemplary divide-by-four switched capacitor divider (SCD) 300 including switch module 205 and capacitors 210 is depicted in FIG. 3B. Other embodiments include other switched capacitor dividers, such as divide by 2 or 3. Such switched capacitor divider embodiments have the advantage of providing multiple ground referenced DC voltage levels (N−1 DC voltage outputs in a divide-by-N circuit), but other switched capacitor circuits which may not produce such a plurality of voltages may also be used. In other embodiments, the capacitance values may be selected such that the voltage divider ratio is not an integer. In the particular divide-by-4 SCD shown, capacitors C1 through C7 are coupled across the input voltage, $V_{in}$, across the series switch module 205 to divide $V_{in}$ by parts.

Nodes between the other capacitors C1, C2, and C3 may similarly provide outputs at $V_{in}$, $\tfrac{3}{4}V_{in}$, and $\tfrac{1}{2}V_{in}$. These nodes are not used in the example of FIG. 2B, but may be used to supply additional voltage levels for a different implementation. Because the voltage levels within the switched capacitor stage is at a fraction of the input voltage, the efficiency of the second stage may be considerably improved.

As depicted, capacitors C1, C2, C3 and C4 each span adjacent A/B switch pairs of the plurality of series switches while capacitors C5, C6 and C7 each span adjacent B/A switch pairs of the plurality of series switches. For the eight switches, numbered SW1 to SW8, from high ($V_{in}$) to low (ground), C1 is coupled at high and between SW2 and SW3. C2 is coupled across a node between SW2 and SW3 and a node between SW4 and SW5. C3 is coupled across the node between SW4 and SW5 and a node between S6 and S7. C4 is coupled across the node between SW6 and SW7 and low. The balancing capacitors starting with C5 are coupled across the other nodes. C5 is coupled across a node between SW1 and SW2 and a node between SW3 and SW4. C6 is coupled across the node between SW3 and SW4 and a node between SW5 and SW6. C7 is coupled across the node between SW5 and SW6 and a node between SW7 and SW8. The capacitance values of capacitors 210 depend upon the current demands on the power delivery network. For typical applications, the capacitance values for C1 through C7 may be all equal and in certain embodiments, the capacitance values for each capacitor are between 10 micro Farads (uF) and 100 uF. Alternating ones of the series FET switches (e.g., switches A) are all coupled together at their gate pins and coupled to a "high" signal during a time period DTs while alternating ones of the series FET switches (e.g., switches B) are all coupled together at their gate pins and driven with a "high" signal during a remaining time period (1−D)Ts, where Ts is the total switching cycle and D is the duty cycle and is typically <50% for buck converters. As such, during a first time interval of the switching cycle, DTs, the A switches are "on" (driven by a digital high signal) while the B switches are "off" (driven by a digital low signal). During the remaining time interval of the switching cycle (1−D)Ts, the B switches are "on" (driven by a digital high signal) while the A switches are "off" (driven by a digital low signal). Thus, while both A and B are driven "on"

during some portion of the switching cycle, A and B are not driven "on" simultaneously during the overall switching cycle lasting Ts.

In the particular embodiment depicted, capacitor C4 is in parallel with one of the four adjacent pairs of AB series switches to provide a voltage division that is one-fourth of the Vin ($V_o=\frac{1}{4}V_{in}$) for the divide-by-four switched capacitor divider (SCD) 300. Because the voltage levels within the switched capacitor stage is at a fraction of the input voltage, the efficiency of the second stage may be considerably improved. In embodiments of the present invention, the divide-by-four SCD 300 may serve as a front end converter stage in the two-stage power deliver network 201, with $V_o$ output from divide-by-four SCD 300 coupled with the input to VR 220. In other embodiments, up to two additional output voltage levels with values between $\frac{1}{4}V_{in}$ and $V_{in}$ may be provided for a multi-output voltage converter. In certain embodiments, the SCD 300 provides no output regulation and the switching frequency is constant for all loads. In certain configurations, voltage regulation is provided by the second stage VR 220 of FIG. 2 (e.g., with duty cycle control of the buck-type converter). It should be appreciated that series switch module 205 may be implemented as a functional block in support of any of the configurations described in U.S. patent application Ser. No. 11/694,391, noted elsewhere herein.

The series switch module 205 may simplify the divide-by-four SCD 300 implementation of the two-stage power delivery network 201 because in an embodiment the series switch module 205 is implemented as a semiconductor IC using field effect transistors (FETs) or other known integrated switch technologies. For example, the series switch module may comprise all NMOS switches. Other embodiments may employ PMOS switches.

The capacitors coupled with the series switch module 205 may then be implemented in a variety of forms, such as, but not limited to, discrete capacitors, metal-insulator-metal (MIM) capacitors and MOS capacitors, depending on the current demands of a particular application. In the particular embodiment depicted in FIG. 3B, capacitors 210 are external to the package of the series switch module 205. Even if capacitors 210 are discrete, the series switch module 205, implemented as an IC will reduce a printed circuit board footprint of the of the first stage in the exemplary two-stage power delivery network 201 relative to a more distributed switch architecture employing discrete switches. Furthermore, parasitics of divide-by-four SCD 300 can be significantly reduced with a series switch module 205 by minimizing the parasitic capacitance of the switches S1-S8 and the parasitic inductance of interconnects between the series switch module 205 and the capacitors 210 by locating the series switch module 205 in close proximity to the capacitors 210.

Figure 3C:
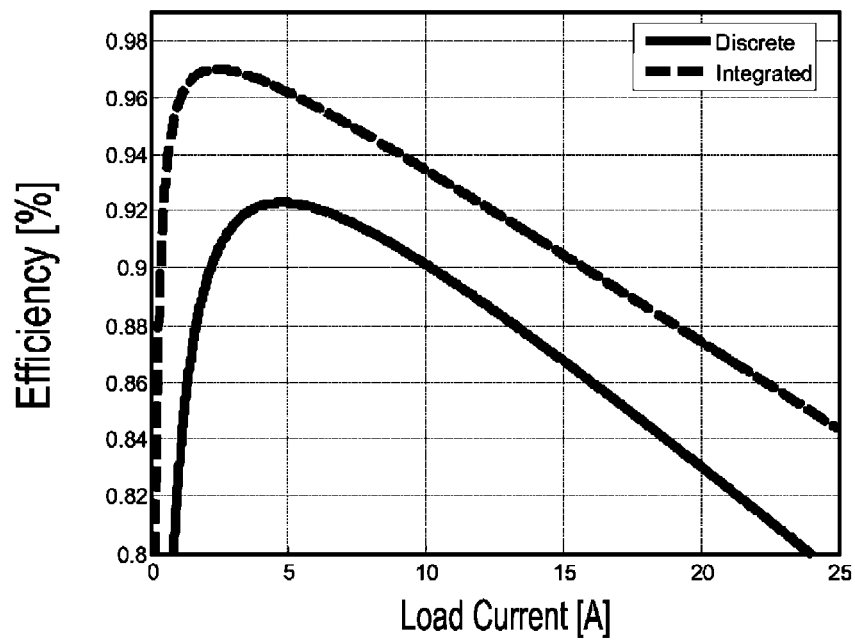
FIG. 3C is a graph depicting the higher efficiency possible in a power delivery network utilizing a switch module integrated in CMOS, in accordance with one embodiment.

The series switch module 205, implemented as a semiconductor IC enables an SCD power delivery stage to have a higher efficiency than is possible with a discrete-power MOSFET (e.g., using lateral diffused MOS (LDMOS) or vertical channel power MOS (VMOS)) switch implementation of an SCD. For example, FIG. 3C depicts a graph of a simulation where the dashed line is the divide-by-four SCD 300 implemented in with a CMOS integrated series switch module 205 and the solid line is a divide-by-four SCD implemented with discrete power switches. As shown, the lower parasitics of the semiconductor integrated series switch and lower on-state resistance contribute to a reduction in losses of such a voltage converter circuit. In this particular example, a 4% improvement in efficiency is observed over the heavy load range. The improvement is even larger (e.g., greater than 5%) at light load. Thus, the manner of implementing the series switch module 205 is an important factor in achieving a performance improvement in a two-stage power delivery network employing a SCD as the first stage rather than a buck-type regulator.

Because parasitics have been found to be significant in a SCD power delivery stage, how the SCD is integrated into a power delivery network for a packaged IC is important. FIGS. 4 through 8 illustrate particular power delivery integration schemes utilizing the series switch module 205.

Figure 4:
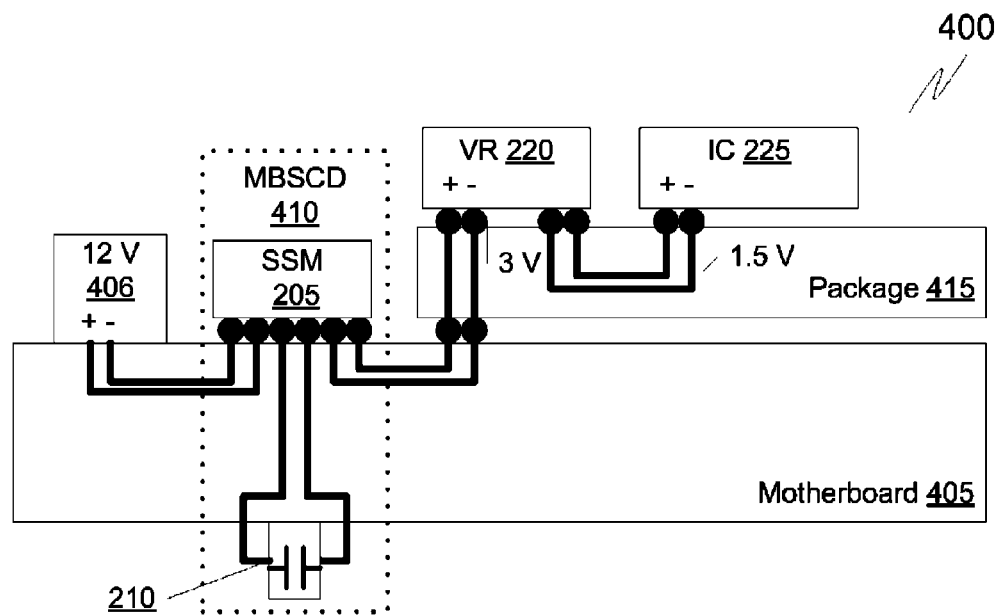
FIG. 4 is a block diagram schematically illustrating a cross-sectional view of a switched capacitor network implemented on a motherboard, in accordance with one embodiment.
Figure 5:
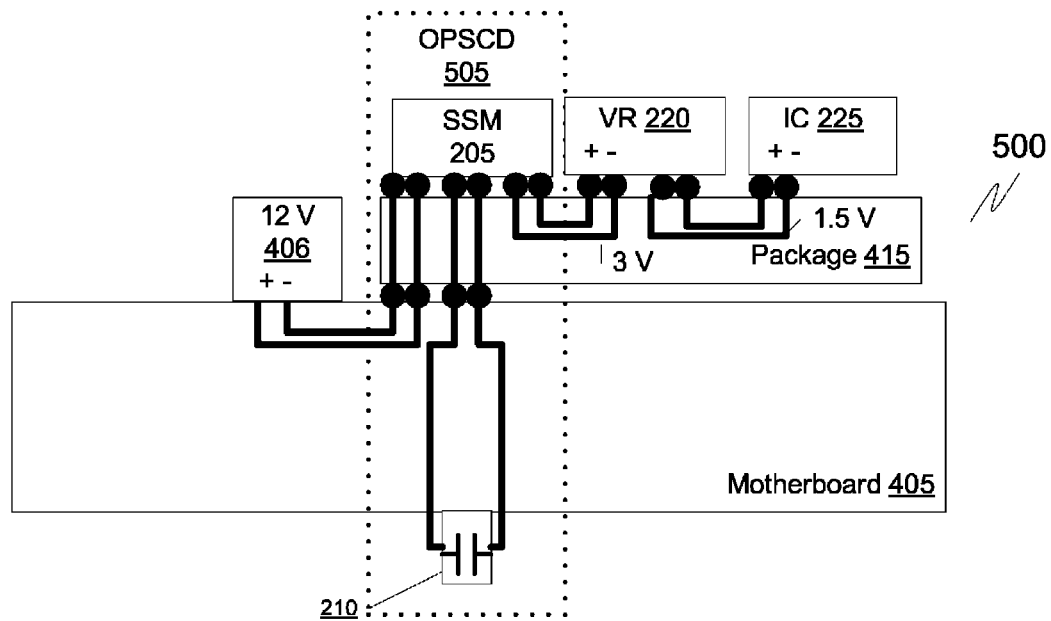
FIG. 5 is a block diagram schematically illustrating a cross-sectional view of a switched capacitor network with a switch module integrated on package, in accordance with one embodiment.

In one embodiment, a first power delivery stage utilizing series switch module 205 and capacitors 210 replaces a buck-type motherboard voltage regulator. FIG. 4 depicts a cross section of a block diagram illustrating an exemplary implementation in system 400 where the 12V supply 406 output is coupled with the input to the motherboard switched capacitor divider (MBSCD) 410. MBSCD 410 includes a series switch module 205 mounted on the motherboard 405. Motherboard 405 is a printed circuit board of any suitable type and can be made of any suitable material, e.g., an organic material, a polyimide, silicon, glass, quartz, ceramic, and the like. With the series switch module 205 located on the motherboard 405, the capacitors 210 are preferably located on the motherboard 405 in close proximity to series switch module 205. In one embodiment, the capacitors 210 are discrete and surface mounted on the motherboard 405, for example on a side of the motherboard 405 opposite the series switch module 205. Capacitors 210 may also be embedded into the motherboard 405, for example below the series switch module 205. With such embodiments, existing motherboard manufacturing techniques employed for surface mount or embedded thin film decoupling capacitors may be extended to implement a motherboard switched capacitor divider for a power delivery network.

As further shown in FIG. 4, the output of the MBSCD 410 is at 3V, for example by implementing the divide-by-four SCD 300 depicted in FIG. 3B. The 3V output from MBSCD 410 is then coupled with the input of VR 220 which regulates the voltage output coupled with the input to IC 225 to 1.5V. As depicted, the VR 220 may be a conventional buck-type regulator integrated onto the package 415. Because switched capacitor networks require no magnetic components, MBSCD 410 may require a smaller area of motherboard 405 than would inductor-based MBVR 110 of FIG. 1 to provide a two-stage power delivery network in a relatively smaller form factor.

In a further embodiment, the SCD power delivery stage of a multi-stage power delivery network is at least partially implemented on the package of the IC to be powered. In an exemplary embodiment depicted in FIG. 5, the system 500 includes on-package switched capacitor divider (OPSCD) 505 power delivery stage and the VR 220 power delivery stage of a two-stage power delivery network are integrated in CMOS (e.g., using 1.5V logic CMOS transistors including either or both NMOS and PMOS) and placed on the package 415. The OPSCD is placed on the same package substrate as the VR 220 and the IC 225. Using relatively shorter interconnects, the output voltage of the OPSCD is directly fed into the VR In the particular embodiment depicted, capacitors 210 are implemented on the motherboard 405 in any manner previously described in FIG. 4. With the OPSCD 505, the footprint of the first power delivery stage on the motherboard 405 is reduced to be only that of the capacitors 210. On-package voltage regulation with OPSCD 505 further reduces interconnect parasitics relative to the MBSCD 410 implementation, allowing the regulator to respond faster to load transients of the powered IC for enhanced performance of the power delivery network.

In another embodiment, the SCD power delivery stage of a multi-stage power delivery network, such as the two-stage power deliver network 201, is implemented entirely on the package of the IC to be powered. In the exemplary system 600 of FIG. 6, embedded switched capacitor divider (eSCD) 605 includes series switch module 205 on package 615 and capacitors 210 embedded in package 615. Thus, all stages of the power delivery network are implemented within the package of the IC 225. In an alternative embodiment, the package of the series switch module 205 includes embedded capacitors 210. In such package embedded capacitor embodiments, space that may be otherwise unoccupied in a conventional package may be utilized without violating space constraints of the package 615.

Capacitors 210 may be embedded in package 615 by any method known in the art, depending on the package 615. For example, in one embodiment, capacitors 210 are thin film or MIM capacitors embedded in package 415. In one implementation, package 615 includes an interposer between series switch module 205 and motherboard 405, the interposer including at least one layer of high permittivity material such as a titanate film that is deposited, for example, by metal-organic chemical vapor deposition (MOCVD) techniques; or a layer of any other type of high permittivity material (i.e. having a dielectric constant greater than that of silicon dioxide). Capacitors 210 may further comprise an embedded capacitor stack, the plates of which may each be separated by a at least one layer of ceramic film having a high permittivity. The $V_{in}$ and ground connections are coupled to the plate electrodes of the embedded capacitor stack using conventional techniques. Embodiments where capacitors 210 are embedded in package 615 as discrete or thin film are preferred because vias through motherboard 405 as well as surface mount sockets may be avoided which significantly reduces parasitic inductance relative to a motherboard switched capacitor divider embodiment, such as that depicted in FIG. 4.

In a further embodiment, the SCD power delivery stage of a multi-stage power delivery network, such as the two-stage power deliver network 201, is implemented monolithically in semiconductor. In one exemplary embodiment, depicted in FIG. 7, system 700 includes an integrated switched capacitor divider (iSCD) 705 which integrates capacitors with a CMOS series switch module. In one such embodiment, capacitors 210 are MIM capacitors integrated onto the silicon substrate of a switched capacitor converter circuitry, such as that found in the divide-by-four SCD 300. While this implementation reduces the cost of the package 415, a high dielectric constant material may be needed in the silicon process to fabricate large enough capacitances, depending on the current requirements of IC 225. Where MIM capacitance values are insufficient, capacitor trees operated over a plurality of phases may be used. For example, capacitors 210 integrated into iSCD 705 may include a tree of 1 uF capacitors operated over 100 phases to provide a 100 uF capacitance for use in the power delivery to IC 225.

Figure 6:
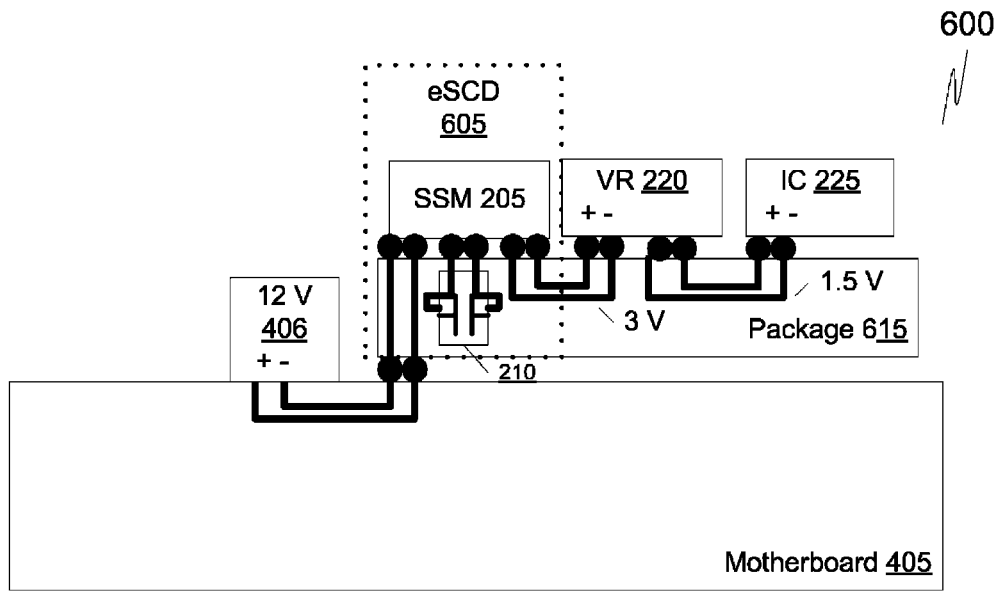
FIG. 6 is a block diagram schematically illustrating a cross-sectional view of a switched capacitor network with a switch module implemented on package and capacitors embedded in the package, in accordance with one embodiment.
Figure 7:
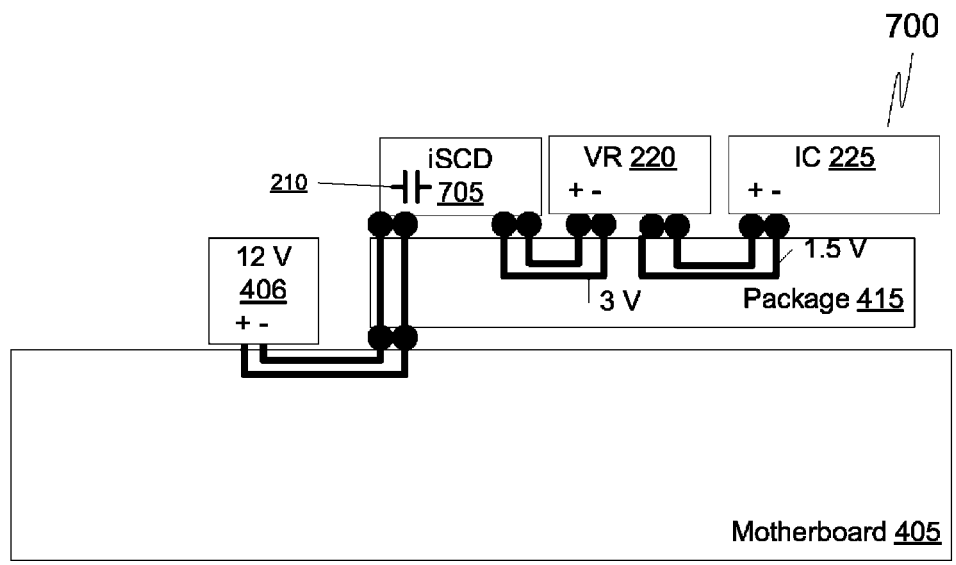
FIG. 7 is a block diagram schematically illustrating a cross-sectional view of a switched capacitor network with a switch module implemented on package and capacitors integrated onto the substrate of the switch module, in accordance with one embodiment.
Figure 8:
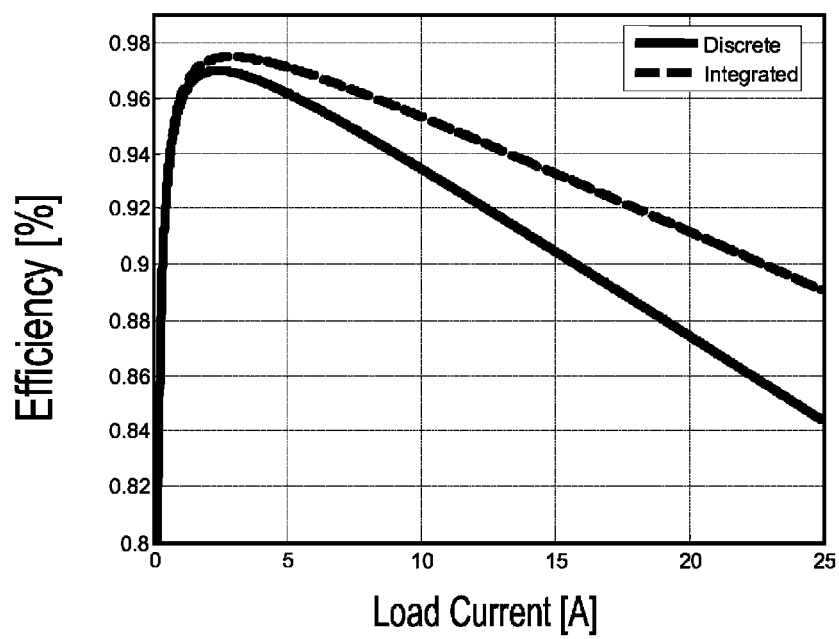
FIG. 8 is a graph depicting the higher efficiency possible with a switched capacitor network utilizing capacitors embedded into the package or integrated onto the switch module, in accordance with particular embodiments.

FIG. 8 is a graph depicting a comparison of a two-stage power delivery network employing the divide-by-four SCD 300 utilizing an integrated series switch module and either discrete capacitors (solid line) or capacitors embedded into the package or integrated onto the switch module (dashed line). As shown, the efficiency of a switched capacitor network power delivery stage utilizing discrete capacitor implementations (e.g., FIG. 4 and FIG. 5) has been found to be significantly less than for implementations integrated the capacitor into either a package or semiconductor of the switch module (FIG. 6 and FIG. 7). The disparity between the solid and dashed lines is attributable to the higher interconnect parasitics for the discrete capacitor implementations. As shown, a 3% efficiency improvement at heavy load is observed for integrated/embedded capacitors.

Thus, integration of switched capacitor networks for power delivery to a packaged IC has been disclosed. One or more of the embodiments described in detail may be employed to provide at least one stage in multi-staged power delivery network to power a processor or other packaged integrated circuit (IC). Although the present invention has been described in language specific to structural features or methodological acts, it is to be understood that the invention defined in the appended claims is not necessarily limited to the specific features or acts described. The specific features and acts disclosed are merely to be understood as particularly graceful implementations of the claimed invention in an effort to illustrate rather than limit the present invention.

What is claimed is:

1. An electronic device comprising:
   a microprocessor in a package coupled to a printed circuit board;
   a switched capacitor divider (SCD) to convert an input power supply voltage to a first output power supply voltage, the SCD including series switches coupled to a plurality of capacitors, wherein the series switches are implemented as a CMOS FET integrated circuit (IC) chip separate from the microprocessor, but also integrated onto the package; and
   a voltage regulator (VR) to convert the first output power supply voltage to a second output power supply voltage, wherein the VR is, external to the IC chip, but also integrated onto the package, and wherein the second output power supply voltage is coupled with the microprocessor to power the microprocessor.

2. The electronic device of claim 1, wherein the plurality of capacitors is integrated within the package.

3. The electronic device of claim 2, wherein the plurality of capacitors comprises metal-insulator-metal (MIM) capacitors integrated onto a silicon substrate of the IC chip.

4. The electronic device of claim 2, wherein the plurality of capacitors comprises MIM capacitors embedded into the package.

5. The electronic device of claim 2, wherein the plurality of capacitors includes at least one of discrete capacitors mounted to the printed circuit board or MIM capacitors embedded into the printed circuit board.

6. The electronic device of claim 1, wherein the series switches further comprise:
   a plurality of CMOS FETs configured in series with drain terminals coupled with source terminals and connected across the input power supply voltage and to a pinout of the IC chip, wherein alternating ones of the plurality have gate terminals coupled together to form at least a first and second pair of gate coupled FETs, and wherein the first pair of gate coupled FETs are to switch between a low state and a high state within a switching cycle while the second pair of gate coupled FETs are to switch to a state opposite that of the first pair of gate coupled FETs; and
   wherein the plurality of capacitors further comprise:
     a capacitor coupled to a drain terminal pinout of each of the first pair of gate coupled FETs; and
     a capacitor coupled to a drain terminal pinout of each of the second pair of gate coupled FETs.

7. A multi-stage power delivery network to deliver power to a first integrated circuit (IC) chip disposed within a package, the network comprising:
  a switched capacitor divider (SCD) stage comprising:
    a second IC chip including a plurality of CMOS FETs configured in series with drain terminals coupled with source terminals, the second IC chip having a plurality of pinouts coupled with the plurality of FET drain terminals and connected across an input voltage, wherein the second IC chip is disposed within the package or is mounted to a printed circuit board; and
    a plurality of capacitors, external to the second IC chip, connected across the voltage input and coupled with the plurality of drain pinouts, ones of the plurality of capacitors to be switched by the plurality of FETs to reduce the input voltage to a first stage output voltage; and
  a buck-type voltage regulator (VR) stage, external to the second IC chip, but disposed within the package, to convert the first stage output voltage to a second stage output voltage coupled to the first IC chip.

8. The multi-stage power delivery network of claim 7, wherein first IC is a microprocessor, wherein the input voltage is approximately 12V, and wherein the first stage output voltage is between approximately 2.8 V and approximately 3.3 V.

9. The multi-stage power delivery network of claim 7, wherein the plurality of capacitors comprises MIM capacitors embedded into the package.

10. The multi-stage power delivery network of claim 7, wherein the plurality of capacitors comprises discrete capacitors mounted to the printed circuit board.

11. The multi-stage power delivery network of claim 7, wherein alternating ones of the plurality CMOS FETs configured in series have gate terminals coupled together to form at least a first and second pair of gate coupled FETs, and wherein the first pair of gate coupled FETs are to switch between a low state and a high state within a switching cycle while the second pair of gate coupled FETs are to switch to a state opposite that of the first pair; and wherein the plurality of capacitors further comprise:
  a capacitor coupled to a drain terminal pinout of each of the first pair of gate coupled FETs; and
  a capacitor coupled to a drain terminal pinout of each of the second pair of gate coupled FETs.

* * * * *